US007010732B2

(12) United States Patent
Firth et al.

(10) Patent No.: US 7,010,732 B2
(45) Date of Patent: Mar. 7, 2006

(54) BUILT-IN TEST SUPPORT FOR AN INTEGRATED CIRCUIT

(75) Inventors: Steven Firth, Stroat Chepstaw (GB); William Bryan Barnes, Bristol (GB)

(73) Assignee: STMicroelectronics Limited, Almondsbury Bristol (GB)

( * ) Notice: Subject to any disclaimer, the term of this patent is extended or adjusted under 35 U.S.C. 154(b) by 508 days.

(21) Appl. No.: 10/068,307

(22) Filed: Feb. 6, 2002

(65) Prior Publication Data
US 2002/0138802 A1 Sep. 26, 2002

(30) Foreign Application Priority Data
Feb. 7, 2001 (GB) ................................. 01301092

(51) Int. Cl.
*G11C 29/00* (2006.01)
*G01R 31/28* (2006.01)
(52) U.S. Cl. ...................... 714/718; 714/726; 365/201
(58) Field of Classification Search ................ 714/718, 714/719, 724, 726, 727; 365/201; 326/16; 324/73.1
See application file for complete search history.

(56) References Cited

U.S. PATENT DOCUMENTS

| 4,546,472 A | * | 10/1985 | Volk et al. ................... 714/724 |
| 4,903,266 A | * | 2/1990 | Hack ............................ 714/719 |
| 5,488,612 A | * | 1/1996 | Heybruck .................... 714/725 |
| 5,883,843 A | * | 3/1999 | Hii et al. ..................... 365/201 |
| 6,242,269 B1 | * | 6/2001 | Whetsel ......................... 438/11 |
| 6,353,563 B1 | * | 3/2002 | Hii et al. ..................... 365/201 |
| 6,622,269 B1 | * | 9/2003 | Ngo et al. ................... 714/718 |
| 6,768,292 B1 | * | 7/2004 | Hapke ........................ 324/73.1 |

FOREIGN PATENT DOCUMENTS

| EP | 0 646 867 A | 4/1995 |
| EP | 0 805 460 A | 11/1997 |

OTHER PUBLICATIONS

"A Tutorial on Built-in Self-test. (part 2 Applications)" Agrawal et al. IEEE Design & Test of Computers, Publication Date: Jun. 1993 pp. 69-77 vol.: 10, Issue:2 ISSN: 0740-7475 Inspec Accession No.: 4464928.*
"A Programmable Built-in Self-test Core for Embedded Memories" Huang et al. Proceedings of the ASP-DAC Design Automation Conference, 2000. Publication Date: Jan. 25-28, 2000 pp. 11-12 Inspec Accession No.: 6596958.*
"An ASIC Library Granular DRAM Macro with Built-in Self-test" Dreibelbis et al. Solid-State Circuits Conference, Digest of Technical Papers Publication Date: Feb. 5-7, 1998 pp. 74-75, 416 Inspec Accession No.: 5979214.*

(Continued)

*Primary Examiner*—Albert Decady
*Assistant Examiner*—Cynthia Britt
(74) *Attorney, Agent, or Firm*—Lisa K. Jorgenson; James H. Morris; Wolf, Greenfield & Sacks, P.C.

(57) ABSTRACT

Test circuitry for testing an integrated circuit, the integrated circuit being configurable to accept input data from stimulus scan cells and to provide output data to response scan cells, the test circuitry including stimulus circuitry for providing test data to the integrated circuit; input selection means operable to control which of the test data and the input data are received at the integrated circuit; capture circuitry for capturing output data from the integrated circuit and generating response data; output selection means operable to select which of the output data and the response data are received by the response scan cells.

25 Claims, 3 Drawing Sheets

OTHER PUBLICATIONS

European Search Report from European application No. 01301092, filed Feb. 7, 2001.

*Array Built-In Self-Test with Diagnostic Logic;* IBM Technical Disclosure Bulletin, US, IBM Corp. New York; vol. 34, No. 1, Jun. 1, 1991; pp. 59-61, XP000210114.

*Semiconductor Manufacturing Process Monitoring Using Built-In Self-Test for Embedded Memories;* International Test Conference, New York, NY, IEEE, vol., Conf. 29, Oct. 19, 1998, pp. 872-881, XP000822431.

* cited by examiner

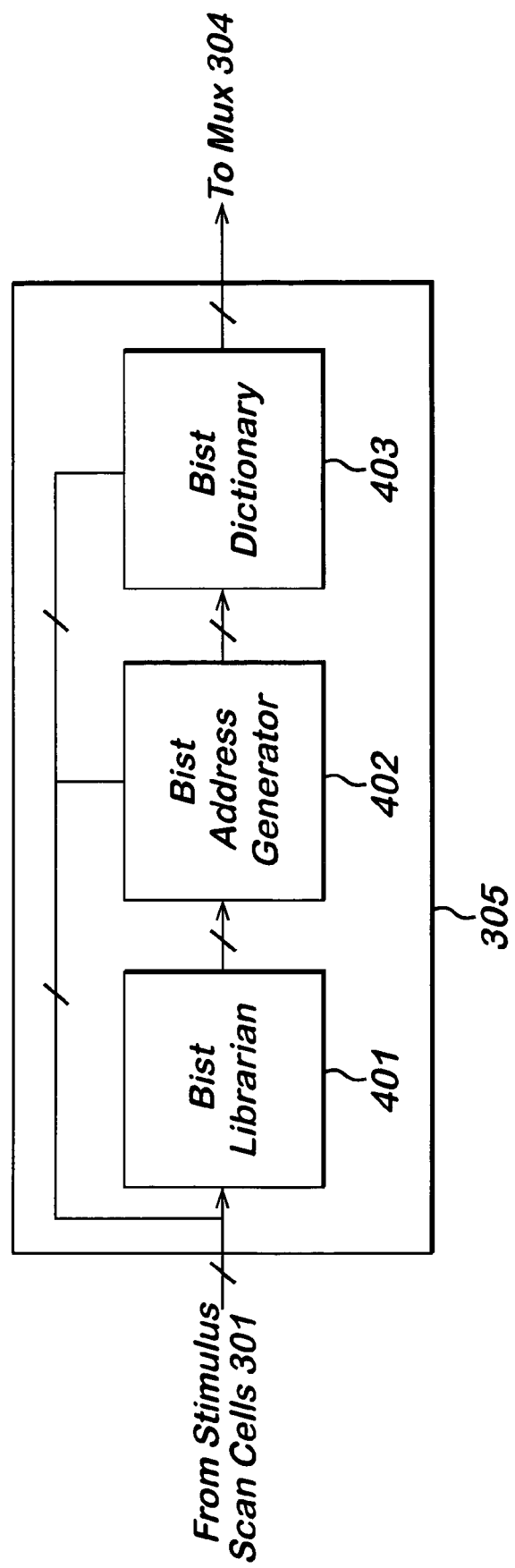

BUILT-IN TEST SUPPORT FOR AN INTEGRATED CIRCUIT

FIELD OF INVENTION

The present invention relates to testing of integrated circuits using built-in testing circuitry.

The invention has been developed primarily for use in testing memory circuitry, and will be described hereinafter with reference to this application. However, it will be appreciated that the invention is not limited to this particular use and can be applied to many other types of integrated circuits having scan chains for data input and output.

BACKGROUND TO INVENTION

Presently, memory testing at integrated circuit level is usually handled in one of two ways. For relatively small memories (say, about 500 bytes or less), existing scan chains can be used. For example, referring to FIG. 1, data is fed serially into stimulus scan cells 10 until they contain the desired input values. The output of the stimulus scan cells 10 is then clocked into a memory location within memory block 11. The memory location is read out into response scan cells 12, and the output is compared with that the original input. This can be done using, for example, a comparator (not shown).

There are a number of standard test data sequences that are used within field of memory testing. These tests are called Marinescu XN tests, where X represents the number of read/write operations per memory location. For example, a 6N test is defined by the following sequence:

w1(up) r1w0(up) r0w1r1(down)

where:
w=write
r=read
(up)=increment the present memory column address
(down)=decrement the present memory column address
Similarly, a 17N test is defined by the following sequence:

w0(up) r0w1w0w1(up) r1w0r0w1(up) r1w0w1w0
(down) r0w1r1w0(down)

Other test sequences exist and can be used depending upon the particular needs of the memory being tested.

An advantage of testing using existing cells is that it avoids the need for additional circuitry. Also, because the data is fed in via scan cells, such testing is relatively flexible, and can be changed at any time with suitable programming. However, using scan chains is also a relatively slow process, because data must be serially input and output from the scan cells prior to being clocked into memory.

For larger memories, the preferred choice for testing is to provide a Built In Self Test ("BIST"). Referring to FIG. 2, the BIST arrangement includes a BIST stimulus generator 20, the output of which is fed into one input of a multiplexor 21. The output of the stimulus scan cells 10 is fed into the other input of the multiplexor 21. The output of the multiplexor 21 is connected to the memory block 11, the output of which is supplied to a demultiplexor 22, which selectively outputs to either a BIST response capture unit 23 or the response scan cells 12.

The multiplexor 21 and the demultiplexor 22 are controlled to toggle the arrangement between a test mode, in which the BIST components interface with the memory block, and an operational mode, in which the scan chains interface directly with the memory block. For clarity, control and timing lines to the various components have been omitted.

One disadvantage with the BIST arrangement is that the stimulus generator is hard coded with a single testing scheme, and this cannot be changed without making fundamental changes in silicon. Moreover, when adding BIST functionality, the various lines used for controlling operation of the BIST components must all be manually routed during the design phase. This increases the chance of human error, which can result in costly redesigns or the production of integrated circuitry that cannot be tested properly.

It would be desirable to provide an arrangement that offers some of the desirable aspects of scan chain testing without the relatively long test times.

SUMMARY OF INVENTION

In a first aspect, the present invention provides test circuitry for testing an integrated circuit, the integrated circuit being configurable to accept input data from stimulus scan cells and to provide output data to response scan cells, the test circuitry including: stimulus circuitry for providing test data to the integrated circuit; input selection means operable to control which of the test data and the input data are received at the integrated circuit; capture circuitry for capturing output data from the integrated circuit and generating response data; output selection means operable to select which of the output data and the response data are received by the response scan cells.

Preferably, the input selection means includes a first multiplexor, the first multiplexor accepting the input data and the test data as inputs and outputting to the test circuitry. In a preferred form, the input selection means includes a first demultiplexor, the first demultiplexor accepting the input data as input and selectively outputting to either the stimulus circuitry or the integrated circuit.

Preferably, the output selection means includes a second multiplexor, the second multiplexor selectively accepting the output data and the response data as inputs and outputting to the response scan cells. In a preferred form, the output selection means includes a second demultiplexor, the second demultiplexor accepting the output data as input and selectively outputting to either the capture circuitry or the response scan cells.

In a preferred embodiment, the test circuitry is configured to receive clock pulses from a clock generator, such that data is clocked into the scan cells with each received clock pulse.

In a particularly preferred embodiment, the test circuitry is configured for selective operation in a test mode and an operative mode, wherein: (a) in the test mode: the stimulus circuitry is configured to receive the input data from the stimulus scan cells; the input selection means is configured such that the integrated circuit receives the test data; and the output selection means is configured such that the response scan cells receive the response data; and (b) in the operative mode: the input selection means is configured such that the integrated circuit receives the input data; and the output selection means is configured such that the response scan cells receive the output data.

Preferably, in the test mode, the stimulus circuitry and the capture circuitry receive clock signals from a clock generator, the stimulus circuitry responding to the clock signals by writing the test data into the memory block when a memory write is enabled. In this embodiment, the capture circuitry responds to the clock signals by reading the response data from the memory block when a memory read is enabled.

Preferable, the stimulus circuitry includes: a dictionary storing a plurality of read/write operation primitives, the primitives being combinable to form at least a first read/write testing sequence; an address generator for generating addresses to which the primitives are written; and a librarian sub-block for receiving the input data, the input data being indicative of a test to be applied to the integrated circuit, the librarian sub-block being configured to control, on the basis of the input data, which of the primitives are provided to the integrated circuit, and the order in which they are provided, based on the input data. In a second aspect, there is provided test circuitry for testing an integrated circuit, the test circuitry including stimulus circuitry and capture circuitry, the stimulus circuitry including: a dictionary storing a plurality of read/write operation primitives, the primitives being combinable to form at least a first read/write testing sequence; and a librarian sub-block for receiving the input data, the input data being indicative of a test to be applied to the integrated circuit, the librarian sub-block being configured to control, on the basis of the input data, which of the primitives are provided to the integrated circuit, and the order in which they are provided, based on the input data; wherein the capture circuitry captures response data from the integrated circuit.

Preferably, the integrated circuit includes a plurality of data addresses upon which the read/write operations are performed, the stimulus circuitry further including an address generator for generating addresses to which the primitives are written.

In a third aspect, there is provided a method of testing an integrated circuit using test circuitry associated therewith, the test circuitry including: stimulus circuitry; input selection means; capture circuitry; and output selection means; the integrated circuit being configurable to accept input data from stimulus scan cells and to provide output data to response scan cells, the method including the steps of: providing test data to the integrated circuit from the stimulus circuitry; operating the input selection means to control which of the test data and the input data are received at the integrated circuit; capturing output data from the integrated circuit using the capture circuitry; generating response data based on the output data; operating the output selection means to select which of the output data and the response data are received by the response scan cells.

Preferably, the input selection means includes a first multiplexor, the first multiplexor accepting the input data and the test data as inputs and outputting to the test circuitry. Preferably also, the input selection means includes a first demultiplexor, the first demultiplexor accepting the input data as input and selectively outputting to either the stimulus circuitry or the integrated circuit.

In a preferred form, the output selection means includes a second multiplexor, the second multiplexor selectively accepting the output data and the response data as inputs and outputting to the response scan cells. More preferably, the output selection means includes a second demultiplexor, the second demultiplexor accepting the output data as input and selectively outputting to either the capture circuitry or the response scan cells.

In particularly preferred form, the test circuitry is configured for selective operation in a test mode and an operative mode, wherein: (a) in the test mode: the stimulus circuitry is configured to receive the input data from the stimulus scan cells; the input selection means is configured such that the integrated circuit receives the test data; and the output selection means is configured such that the response scan cells receive the response data; and (b) in the operative mode: the input selection means is configured such that the integrated circuit receives the input data; and the output selection means is configured such that the response scan cells receive the output data.

Preferably, in the test mode, the stimulus circuitry and the capture circuitry receive clock signals from a clock generator, the stimulus circuitry responding to the clock signals by writing the test data into the memory block when a memory write is enabled, and the capture circuitry responding to the clock signals by reading the response data from the memory block when a memory read is enabled.

In a preferred form, the stimulus circuitry includes: a dictionary storing a plurality of read/write operation primitives, the primitives being combinable to form at least a first read/write testing sequence; an address generator for generating addresses to which the primitives are written; and a librarian sub-block for receiving the input data, the input data being indicative of a test to be applied to the integrated circuit, the librarian sub-block being configured to control, on the basis of the input data, which of the primitives are provided to the integrated circuit, and the order in which they are provided, based on the input data.

In a fourth aspect, the present invention provides a method for testing an integrated circuit using test circuitry, the test circuitry including stimulus circuitry and capture circuitry, the stimulus circuitry including: a dictionary storing a plurality of read/write operation primitives, the primitives being combinable to form at least a first read/write testing sequence; and a librarian sub-block; the method including the steps of: receiving input data at the librarian sub-block, the input data being indicative of a test to be applied to the integrated circuit; selecting, on the basis of the input data and using the librarian sub-block, one or more of the primitives and an order of the primitives so selected; providing the selected primitives to the integrated circuit in the selected order; and capturing response data from the integrated circuit using the capture circuitry.

Preferably, the integrated circuit includes a plurality of data addresses upon which the read/write operations are performed, the stimulus circuitry further including an address generator for generating addresses to which the primitives are written.

In preferred forms of each aspect of the invention, the integrated circuit is a memory circuit or a memory block forming part of a larger integrated circuit.

BRIEF DESCRIPTION OF DRAWINGS

Preferred embodiments of the invention will now be described, by way of example only, with reference to the accompanying drawings, in which:

FIG. 4 is schematic of an alternative embodiment of test circuitry according to the invention.

DETAILED DESCRIPTION OF PREFERRED AND OTHER EMBODIMENTS

Figure 1:
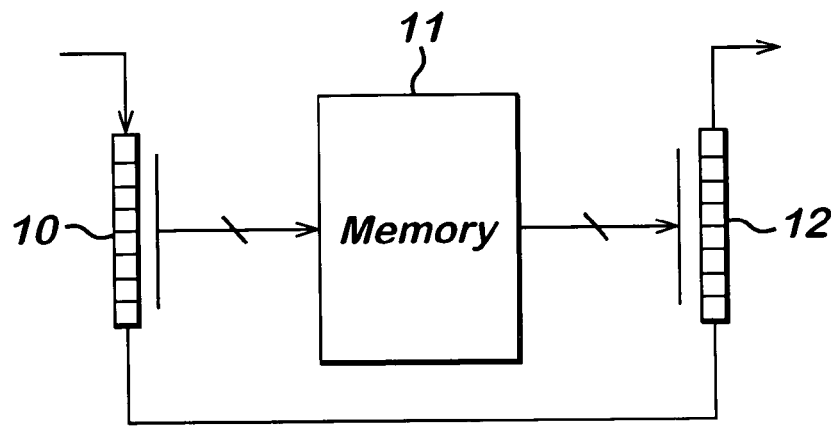
FIG. 1 is a schematic of a prior art memory circuit in which testing is accomplished by clocking data into a scan chain in accordance with instructions from an external controller.
Figure 2:
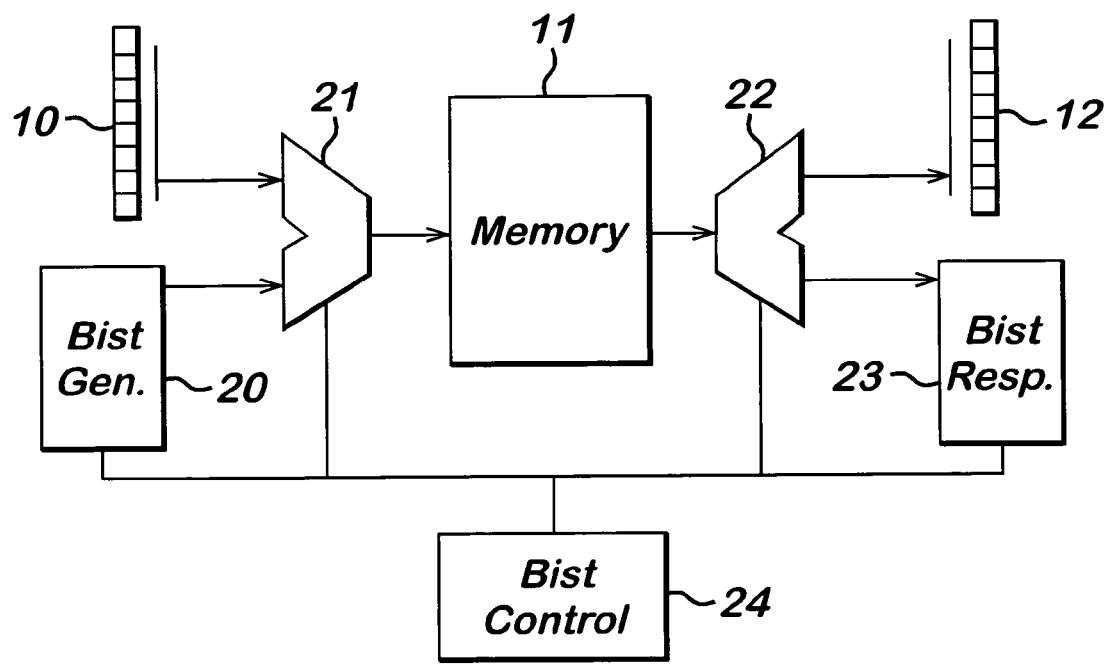
FIG. 2 is a schematic of an alternative prior art memory circuit, designed to be tested by means of Built In Self Test ("BIST") circuit.
Figure 3:
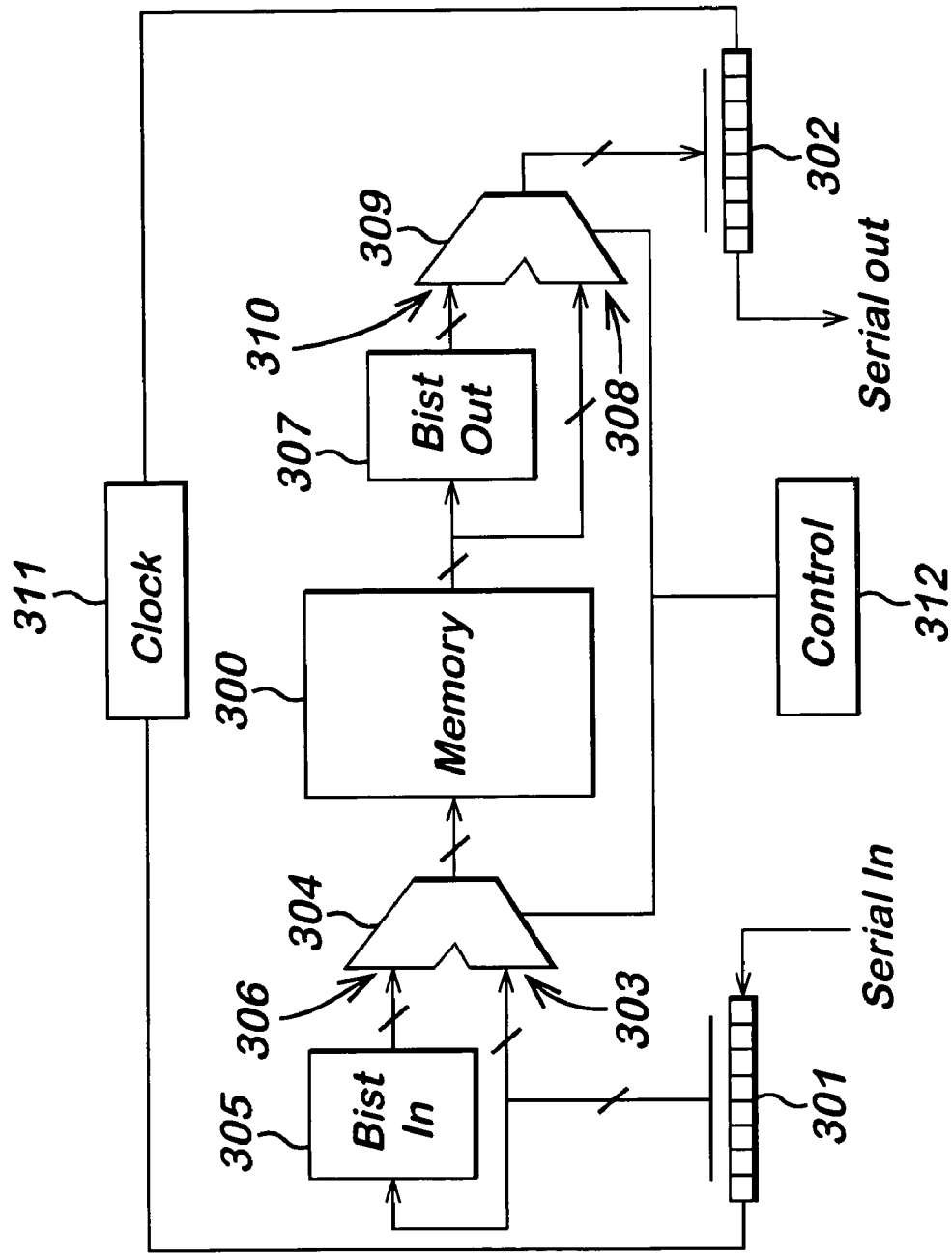
FIG. 3 is a schematic of a first embodiment of test circuitry according to the invention, configured to test a memory circuit.

Referring to the FIG. 3, operative circuitry in the form of a block of memory 300 is provided with scan chains for input and output in the form of stimulus scan cells 301 and response scan cells 302. The stimulus scan cells accept serial input and provide a parallel output both to a first input 303 of a first multiplexor 304 and to the input of stimulus circuitry 305. The output of the stimulus circuitry 305 is provided to a second input 306 of the first multiplexor 304. The output of the first multiplexor 304 is connected to an input of the memory block 300.

An output of the memory block 300 is connected both to an input of capture circuitry 307 and to a first input 308 of a second multiplexor 309. The output of the second multiplexor 309 is connected to the input of the response scan cells, which are configured to clock data out serially.

Clock signals are provided to the various components from a clock generator 311, and control signals are provided by control circuitry 312 to enable reads, writes and shifts of the various circuit components. Much of the specifics of the control signal and clock interaction are not described in detail, since the requisite signals will be well understood by those skilled in the field of microelectronic and integrated circuit design.

In use, the circuitry operates in one of two modes. In a first mode, the control circuitry 312 outputs signals to the first multiplexor 304 and the second multiplexor 309 such that the respective first inputs of each are selected. In this mode, the circuitry as a whole behaves as if the output of the stimulus scan cells is connected directly to the input of memory block 300 and the output of the memory block 300 is connected directly to the response scan cells. The circuitry in this mode effectively behaves as though no test circuitry has been provided, and is the default mode in which the circuitry operates once installed in a final product.

The other mode is a test mode, in which the control circuitry routes the output of the stimulus circuitry 305 to the memory block 300, and the output of the capture circuitry 307 to the response scan cells 302. In this mode, data from the stimulus scan cells is fed to the stimulus circuitry 305. The data clocked into the stimulus scan cells 301 in this mode is control data that, when fed to the stimulus circuitry 305, selects which memory test is to be applied to the memory block during the clock cycles that follow.

In the simplest embodiment, the stimulus circuitry stores a single Marinescu test, and the data input to the stimulus scan cells and clocked to the stimulus circuitry acts simply as a commencement signal. However, it is preferred that the stimulus circuitry be capable of applying two or more Marinescu tests to the memory block.

One way of achieving this is to store complete copies of the tests required (eg, 6N, 17N etc) within the testing circuitry or associated memory, along with an identifier for each test. The particular test to be applied is selected by clocking its associated identifier serially into the stimulus scan cells when the circuitry is in the test mode, and then clocking the identifier into the test circuitry. Subsequent clock cycles whilst the circuitry remains in test mode cause the test circuitry to output the requisite test data into the memory block in the correct order to the correct addresses.

At appropriate times, the capture circuitry reads the contents of memory locations. As the data from the locations is read into the capture circuitry, it is manipulated by means of a hash function to generate an output string that is clocked into the response scan cells once the test is finished. If the output string is correct given the test applied and the memory block design and configuration, then the likelihood that the memory is functioning correctly is a statistical function of the number of bits in the string. For example, if the string is 8 bits wide, then the chance that the memory block is working correctly is better than 96% (ie, one in 256).

The hash function selected and how it is applied are not described in detail, since hash functions in general and their role as check strings in large scale testing are well known to those skilled in the art.

Another aspect of the invention will now be described with reference to FIG. 4 in that embodiment, the stimulus circuitry includes a number of sub-blocks that distinguish it from the embodiment described above. These sub-blocks include a librarian 401, an address generator 402 and a dictionary 403. In the testing mode, these blocks are controlled by way of data clocked into the test circuitry from the stimulus scan cells.

The dictionary 403 stores a number of primitive read and write operations that can be combined to give more complicated and useful tests. For example, the 17N test set out above uses the following combinations of read/write operations:

w rwrw rwww

This is clearly considerably less data than the entire sequence. More importantly, however, given enough primitives, it is possible to construct any test sequence without having to construct them from individual read/write operations. For any potential range of read/write sequences that would conceivably be required for a given circuit, there will be a balance between the number of primitives stored and the length that the sequence defining the order of the primitives will need to be.

On the basis of the requested test, the librarian 401 assembles a string defining the sequence of primitives required for that test, and then passes this onto the address generator 402 to generate the correct traversal order for the memory rows and columns. Once this is done, the result is passed to the dictionary 403, so that the actual read/write primitives can be expanded to include the full width data strings for each write operation, at which point they are clocked into the memory.

The primitives in the sequence are loaded one at a time, and then all the memory addresses are traversed, with the required read and write operations being implemented. Once each primitive is run for all of the addresses, the next primitive in the sequence is loaded and applied to the addresses in the correct traversal order. This is repeated until all of the primitives have been applied to all of the addresses. The reading procedure occurs in the same way as described in relation to the previous aspect of the invention.

The results from the read operations are output to a compression register (not shown) within the capture circuitry, and an output signature is generated for output to the response scan cells, as described above.

It will be appreciated that, in other embodiments, the library and/or the dictionary can be provided with the primitives from an external source prior to the test being run. In this way, an even wider range of tests and more flexibility can be provided for those writing the software testing routines.

Those skilled in the art will understand that the second aspect of the invention, in which a librarian unit is provided, need not be controlled using scan chains. However, this aspect still offers increased flexibility compared to the prior art BIST approach.

It will be appreciated that the provision of address generation in (or associated with) the test circuitry is only relevant when the integrated circuit to be tested is itself addressable. In many cases, the circuitry being tested is not addressable as such, and so it is not necessary to provide address traversal information. Non-addressable integrated circuits will also require tests different from the Marinescu tests described above, such tests being known to those skilled in the relevant art.

It will also be understood that although the preferred embodiment uses Marinescu algorithms to test memory circuits, other algorithms can also be used with the various aspects of the invention. The invention can also be applied to integrated circuitry other than memory circuits, such as logic circuitry and the like.

In practical terms, the way in which the preferred embodiments are wired means that it is less likely that human designers will introduce routing errors compared with prior art memory-testing arrangements. Also, the present invention, at least in its preferred form, enables tests to be designed or selected at the memory block level, rather than at chip level. Accordingly, responsibility for design of the tests to be implemented by the testing circuitry are under the control of the chip designer rather than being left to a testing or production engineer later in the product design and development process. In practice, the designer can provide the requisite test patterns to the testing or production engineers in the form of, for example, a test file containing the required test sequences. All of these factors help reduce the chance of errors or omissions in chip circuitry. Conversely, the invention, at least in its preferred form, enables simulations to be implemented at block rather than chip level, thereby reducing the amount of time ad resources required.

Although the invention has been described with reference to a number of specific examples, it will be appreciated that the invention may be embodied in many other forms. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. Test circuitry for testing an integrated circuit, the integrated circuit being configurable to accept input data from stimulus scan cells and to provide output data to response scan cells, the test circuitry including:
   stimulus circuitry configured to receive the input data from the stimulus scan cells and for providing test data to the integrated circuit;
   input selection means operable to control which of the test data and the input data are received at the integrated circuit;
   capture circuitry for capturing output data from the integrated circuit and generating response data;
   output selection means operable to select which of the output data and the response data are received by the response scan cells.

2. Test circuitry according to claim 1, wherein the input selection means includes a multiplexor, the multiplexor accepting the input data and the test data as inputs and outputting to the test circuitry.

3. Test circuitry according to claim 1, wherein the output selection means includes a multiplexor, the multiplexor selectively accepting the output data and the response data as inputs and outputting to the response scan cells.

4. Test circuitry according to claim 1, wherein the input selection means includes a demultiplexor, the demultiplexor accepting the input data as input and selectively outputting to either the stimulus circuitry or the integrated circuit.

5. Test circuitry according to claim 1, wherein the output selection means includes a demultiplexor, the demultiplexor accepting the output data as input and selectively outputting to either the capture circuitry or the response scan cells.

6. Test circuitry according to claim 1, configured to receive clock pulses from a clock generator, such that data is clocked into the scan cells with each received clock pulse.

7. Test circuitry according to claim 1, configured for selective operation in a test mode and an operative mode, wherein:
   (a) in the test mode:
      the input selection means is configured such that the integrated circuit receives the test data; and
      the output selection means is configured such that the response scan cells receive the response data; and
   (b) in the operative mode:
      the input selection means is configured such that the integrated circuit receives the input data; and
   the output selection means is configured such that the response scan cells receive the output data.

8. Test circuitry according to claim 7, wherein the integrated circuit is a memory circuit.

9. Test circuitry according to claim 8, wherein, in the test made, the stimulus circuitry and the capture circuitry receive clock signals from a clock generator, the stimulus circuitry responding to the clock signals by writing the test data into the memory circuit when a memory write is enabled, and the capture circuitry responding to the clock signals by reading the response data from the memory circuit when a memory read is enabled.

10. Test circuitry according to claim 1, wherein the stimulus circuitry includes:
   a dictionary storing a plurality of read/write operation primitives, the primitives being combinable to form at least a first read/write testing sequence;
   an address generator for generating addresses to which the primitives are written: and
   a librarian sub-block for receiving the input data, the input data being indicative of a test to be applied to the integrated circuit, the librarian sub-block being configured to control, on the basis of the input data, which of the primitives are provided to the integrated circuit, and the order in which they are provided, based on the input data.

11. Test circuitry for testing an integrated circuit, the test circuitry including stimulus circuitry and capture circuitry, the stimulus circuitry including:
   a dictionary storing a plurality of read/write operation primitives, the primitives being combinable to form at least a first read/write testing sequence; and
   a librarian sub-block for receiving the input data, the input data being indicative of a test to be applied to the integrated circuit, the librarian sub-block being configured to control, on the basis of the input data, which of the primitives are provided to the integrated circuit, and the order in which they are provided, based on the input data;
   wherein the capture circuitry captures response data from the integrated circuit.

12. Test circuitry according to claim 11, wherein the integrated circuit includes a plurality of data addresses upon which the read/write operations are performed, the stimulus circuitry further including an address generator for generating addresses to which the primitives are written.

13. A method of testing an integrated circuit using test circuitry associated therewith, the test circuitry including:
   stimulus circuitry;
   input selection means;
   capture circuitry; and
   output selection means;
   the integrated circuit being configurable to accept input data from stimulus scan cells and to provide output data to response scan cells, the method including the steps of:
   providing input data from the stimulus scan cells to the stimulus circuitry and test data to the integrated circuit from the stimulus circuitry;
   operating the input selection means to control which of the test data and the input data are received at the integrated circuit;
   capturing output data from the integrated circuit using the capture circuitry; generating response data based on the output data;
   operating the output selection means to select which of the output data and the response data are received by the response scan cells.

14. A method according to claim 13, wherein the input selection means includes a multiplexor, the multiplexor accepting the input data and the test data as inputs and outputting to the test circuitry.

15. A method according to claim 13, wherein the output selection means includes a multiplexor, the multiplexor selectively accepting the output data and the response data as inputs and outputting to the response scan cells.

16. A method according to claim 13, wherein the input selection means includes a demultiplexor, the demultiplexor accepting the input data as input and selectively outputting to either the stimulus circuitry or the integrated circuit.

17. A method according to claim 13, wherein the output selection means includes a demultiplexor, the demultiplexor accepting the output data as input and selectively outputting to either the capture circuitry or the response scan cells.

18. A method according to claim 13, the test circuitry being configured to receive clock pulses from a clock generator, such that data is clocked into the scan cells with each received clock pulse.

19. A method according to claim 13, wherein the test circuitry is configured for selective operation in a test mode and an operative mode, wherein:
   (a) in the test mode:
   the input selection means is configured such that the integrated circuit receives the test data; and
   the output selection means is configured such that the response scan cells receive the response data; and
   (b) in the operative mode:
   the input selection means is configured such that the integrated circuit receives the input data, and
   the output selection means is configured such that the response scan cells receive the output data.

20. A method according to claim 19, wherein the integrated circuit is a memory circuit.

21. A method according to claim 20, wherein; in the test mode, the stimulus circuitry and the capture circuitry receive clock signals from a clock generator, the stimulus circuitry responding to the clock signals by writing the test data into the memory circuit when a memory write is enabled, and the capture circuitry responding to the clock signals by reading the response data from the memory circuit when a memory read is enabled.

22. A method according to claim 13, wherein the stimulus circuitry includes:
   a dictionary storing a plurality of read/write operation primitives, the primitives being combinable to form at least a first read/write testing sequence;
   an address generator for generating addresses to which the primitives are written, and
   a librarian sub-block for receiving the input data, the input data being indicative of a test to be applied to the integrated circuit, the librarian sub-block being configured to control, on the basis of the input data, which of the primitives are provided to the integrated circuit, and the order in which they are provided, based on the input data.

23. A method for testing an integrated circuit using test circuitry, the test circuitry including stimulus circuitry and capture circuitry, the stimulus circuitry including:
   a dictionary storing a plurality of read/write operation primitives, the primitives being combinable to form at least a first read/write testing sequence; and
   a librarian sub-block;
   the method including the steps of:
   receiving input data at the librarian sub-block, the input data being indicative of a test to be applied to the integrated circuit;
   selecting, on the basis of the input data and using the librarian sub-block, one or more of the primitives and an order of the primitives so selected;
   providing the selected primitives to the integrated circuit in the selected order; and
   capturing response data from the integrated circuit using the capture circuitry.

24. A method according to claim 23, wherein the integrated circuit includes a plurality of data addresses upon which the read/write operations are performed, the stimulus circuitry further including an address generator for generating addresses to which the primitives are written.

25. Test circuitry for testing an integrated circuit, the integrated circuit being configurable to accept input data from stimulus scan cells and to provide output data to response scan cells, the test circuitry including:
   stimulus circuitry configured to receive the input data from the stimulus scan cells and for providing test data to the integrated circuit;
   input circuitry operable to control which of the test data and the input data are received at the integrated circuit;
   capture circuitry for capturing output data from the integrated circuit and generating response data;
   output circuitry operable to select which of the output data and the response data are received by the response scan cells.

* * * * *